United States Patent
Lee (10) Patent No.: US 9,733,744 B2
(45) Date of Patent: Aug. 15, 2017

(54) DISPLAY MODULE

(71) Applicant: SAMSUNG DISPLAY CO., LTD., Yongin-si, Gyeonggi-Do (KR)

(72) Inventor: Sangjo Lee, Hwaseong-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 14/953,875

(22) Filed: Nov. 30, 2015

(65) Prior Publication Data

US 2016/0205794 A1 Jul. 14, 2016

(30) Foreign Application Priority Data

Jan. 13, 2015 (KR) .................... 10-2015-0006053

(51) Int. Cl.
*G06F 1/16* (2006.01)
*G06F 3/041* (2006.01)
*H05K 5/02* (2006.01)

(52) U.S. Cl.
CPC .......... *G06F 3/0412* (2013.01); *G06F 1/1616* (2013.01); *G06F 1/1624* (2013.01); *H05K 5/0252* (2013.01); *G06F 1/1643* (2013.01); *G06F 2203/04102* (2013.01)

(58) Field of Classification Search
CPC .... G06F 1/1616; G06F 1/1624; G06F 1/1662; G06F 1/1652; G06F 3/0416; G06F 1/1641; G06F 1/1643; G06F 1/1626; G06F 1/1677; G06F 1/1681; G06F 1/1694; G06F 1/1622; G06F 1/1628; G06F 1/1637; G06F 1/165; G06F 1/1686; G06F 1/169; H05K 5/0252; H05K 1/028; H05K 2201/10128; H05K 1/147; H05K 1/181; H05K 1/189; H05K 5/0217; H05K 5/0226; H05K 5/03; H05K 1/02; H05K 5/02; H05K 7/1427
USPC ............ 361/679.27, 679.26, 679.21, 679.02; 345/173; 349/58–60
See application file for complete search history.

(56) References Cited

U.S. PATENT DOCUMENTS

| | | | |
|---|---|---|---|
| 2013/0058063 A1 | 3/2013 | O'Brien | |
| 2014/0042293 A1* | 2/2014 | Mok | G06F 1/1652 248/682 |
| 2014/0226275 A1* | 8/2014 | Ko | G06F 1/1626 361/679.27 |

FOREIGN PATENT DOCUMENTS

| KR | 10-2011-0100936 A | 9/2011 |
|---|---|---|
| KR | 10-2012-0083255 A | 7/2012 |
| KR | 10-2012-0106662 A | 9/2012 |
| KR | 10-2013-0080937 A | 7/2013 |

* cited by examiner

*Primary Examiner* — Anthony Haughton
*Assistant Examiner* — Ingrid Wright
(74) *Attorney, Agent, or Firm* — Lee & Morse, P.C.

(57) ABSTRACT

A display module includes first, second and third parts. The first part includes a first display area. The second part includes a second display area. The third part is between the first and second parts and includes a folding axis. The third part moves from a first position to a second position when a force is applied. The first part folds over the second part along the folding axis to block the entire second display area when the third part is in the first position. The first part is offset relative to the second part to allow a portion of the second display area to be exposed to display an image when the third part is in the second position.

18 Claims, 10 Drawing Sheets

DISPLAY MODULE

CROSS-REFERENCE TO RELATED APPLICATION

Korean Patent Application No. 10-2015-0006053, filed on Jan. 13, 2015, and entitled, "Display Module," is incorporated by reference herein in its entirety.

BACKGROUND

1. Field

One or more embodiments described herein relate to a display module.

2. Description of the Related Art

Flexible display modules may be folded or rolled like paper and therefore are easily portable and convenient to use.

SUMMARY

In accordance with one or more embodiments, a display module includes a first part including a first display area; a second part including a second display area; and a third part between the first and second parts and including a folding axis extending in a first direction, the third part is to move from a first position to a second position when a force is applied, wherein: the first part is folded over the second part along the folding axis to block the entire second display area when the third part is in the first position, and the first part is offset relative to the second part to allow a portion of the second display area to be exposed to display an image when the third part is in the second position. The first and second parts may move in a second direction when the force is applied, the second direction crossing the first direction. The first part and the second part may move in opposite directions.

The third part may include a first side coupled to the first part and including a first axis of rotation substantially parallel to the folding axis; and a second side coupled to the second part and including a second axis of rotation substantially parallel to the folding axis, the third part may rotate relative to at least one of the first axis of rotation or the second axis of rotation when the force is applied. The first part may move in a direction opposite to the second direction and the third part may rotate relative to the second axis of rotation when the force is applied. The second part may move in the second direction and the third part may rotate relative to the first axis of rotation when the force is applied.

The third part may include a first release part coupled to the first part and having a width that is to change when the first part moves, a second release part coupled to the second part and having a width that is to change when the second part moves, each of the widths of the first and the second release parts measured in the second direction; and a connector to couple the first release part and the second release part, the connector overlapping the folding axis. The width of the first release part may decrease when force is applied to the first part in a direction opposite to the second direction. The width of the second release part may increase when force is applied to the second part in a direction opposite to the second direction.

In accordance with one or more other embodiments, a display module includes a display panel including a first display area, a folding area, and a second display area arranged in a plane defined by a first direction and a second direction; and a housing coupled to the display panel, the housing to fold and unfold relative to a folding axis substantially parallel to the first direction, wherein the housing includes: a first body part overlapping the first display area; a second body part overlapping the second display area; and a third body part including the folding area and coupling the first body to the second body, the third body is to move when a force is applied to move the first body part over the second body part, a first portion of the second display area covered by the first body part and a second portion of the second display area uncovered by the first body part, the second portion of the second display area to display a first image when the first body part is over the second body part.

At least one of the first or second body parts may move in the second direction when the force is applied. The first body part and the second body part may move in opposite directions. Each of the first and second body parts may include a supporter to support the display panel and a coupler to couple the supporter to the third body part, the third body part may include a first coupling hole including the coupler of the first body part to couple the first and third body parts, and a second coupling hole including the coupler of the second body part to couple the second and third body parts, the first coupling hole may be at a first side of the third body part and the second coupling hole may be at a second side of the third body part, and the third body part may rotate relative to at least one of the first or second coupling holes when the force is applied.

The first coupling hole maybe a sliding hole, and the coupler of the first body part may move along the sliding hole and the third body part is to rotate relative to the second coupling hole when the force is applied. The third body may include a center region overlapping the folding axis; a first release part connected to the center region and coupled to the first body part; and a second release part connected to the center region and coupled to the second body part, a width of at least one of the first or second release parts to change force when the force is applied. The first release part may receive a higher level of strain than the first body part when the force is applied. The first release part may have elasticity to deform in width in the first direction.

Each of the first and second release parts may include a plurality of rumples to move in the first direction and arranged in the second direction, an interval between the rumples to change when the force is applied. The first display area, the second display area, and the folding area may be on substantially a same plane when the housing is unfolded, and the first and second display areas may face each other and the first body part is to cover the first and second portions of the second display area when the housing is folded.

The display panel may display a second image when the housing is unfolded, the display panel may display the first image different from the second image on the second portion of the second display area, the first display part to cover the first portion of the second display area and the second portion of the second display area exposed to display the first image when the force is applied.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described more fully hereinafter with reference to the accompanying drawings; however, they may be embodied in different forms and should not be construed as limited to the embodiments herein. Rather, these embodiments are provided so that this disclosure will be thorough and complete, and will fully convey exemplary implementations to those skilled in the art. The embodiments may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1A:
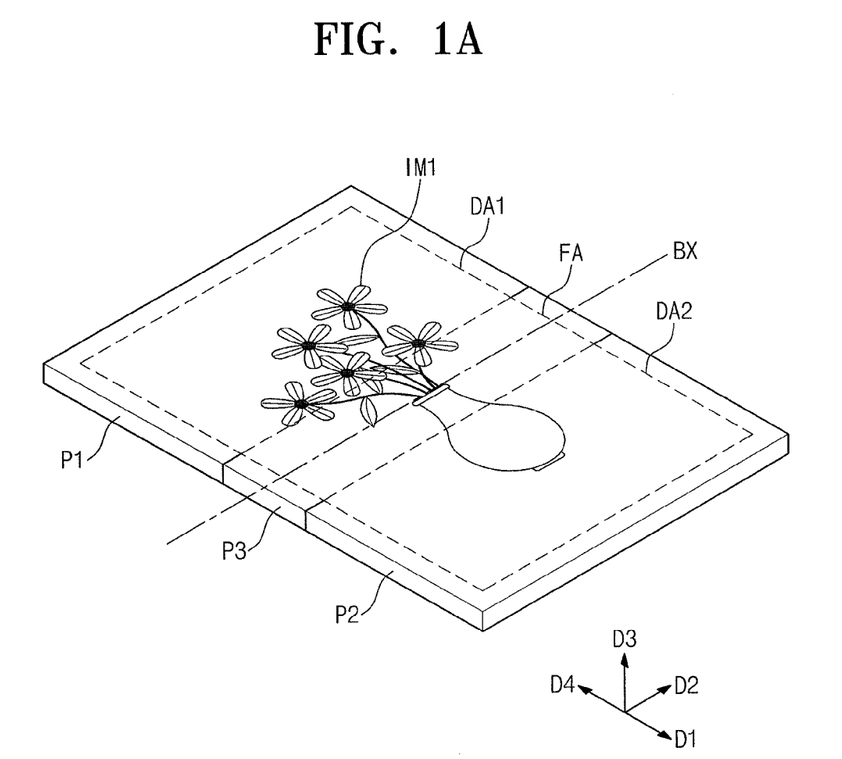
FIGS. 1A-1C illustrate an embodiment of a display module.
Figure 1B:
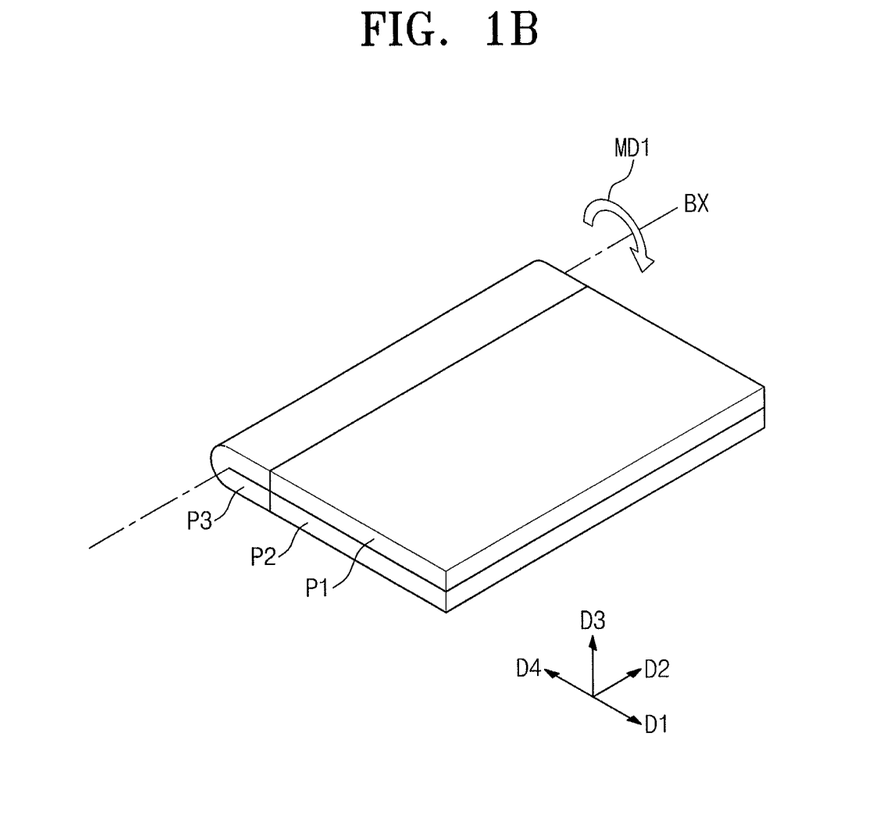
Figure 1C:
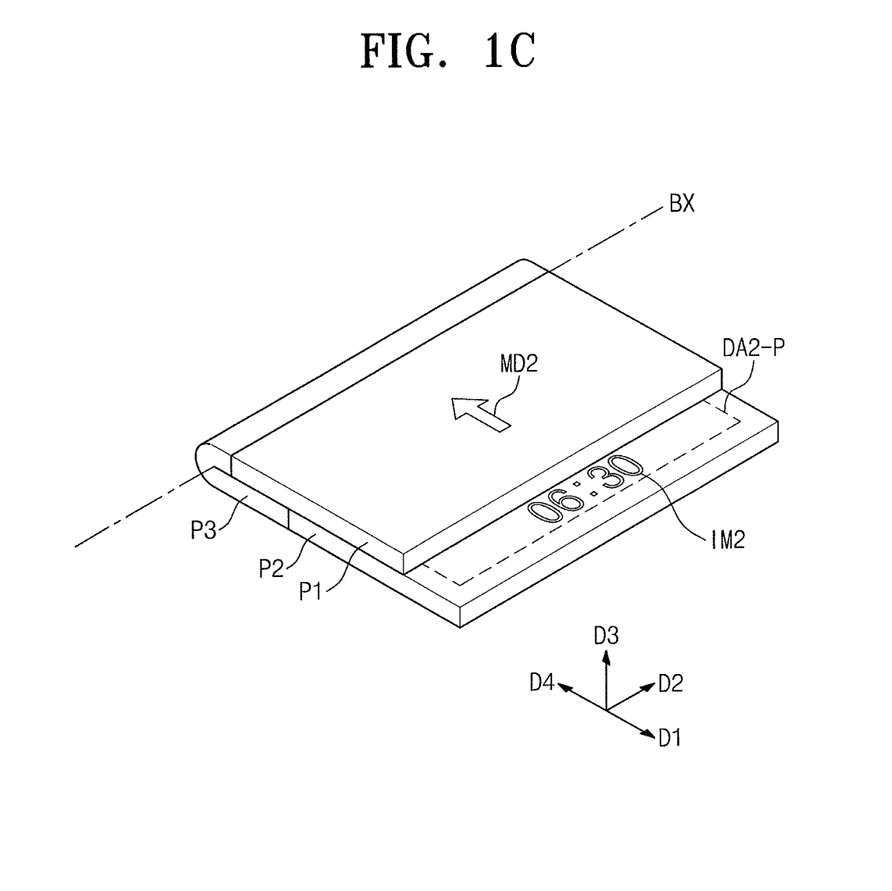

FIG. 1A illustrates an embodiment of a display module in a spread mode, FIG. 1B illustrates the display module in a folding mode, and FIG. 1C illustrates the display module in a sliding mode. As shown in FIGS. 1A to 1C, the display module includes a first part P1 including a first display area DA1, a second part P2 including a second display area DA2, and a third part P3 including a folding area FA. The third part P3 is between the first part P1 and the second part P2.

The first and second display areas DA1 and DA2 display images based on electrical signals. Images displayed in the first display area DA1 may be identical to, different from, related to, or independent from images displayed in the second display area DA2. The first and second display areas DA1 and DA2 may be isolated from each other on a two-dimensional plane in first and second directions D1 and D2. The folding area FA is between the first and second display areas DA1 and DA2.

As shown in FIG. 1A, the first and second display areas DA1 and DA2 are in outward positions in spread mode, e.g., positions in which a viewer may view the first and second display areas DA1 and DA2. Thus, a user may visually recognize information displayed in the first and second display areas DA1 and DA2 in spread mode. According to one example, the display module may display a first image IM1. The first image IM1 may be a single image having segments respectively displayed in the first display area DA1, the second display area DA2, and the folding area FA. According to another example, the first image IM1 may include a plurality of independent images which are respectively displayed in one or more of the first display area DA1, the second display area DA2, and the folding area FA.

As shown in FIGS. 1A and 1B, the display module may be folded or unfolded along a folding axis BX extending in the second direction D2. In order to move from an unfolded state to a folded state, the first part P1 is rotationally moved (MD1) relative to the folding axis BX until the first part P1 overlaps and/or is on the second part P2. When folded, no portion of the second display area DA2 is viewable because it is covered by the first part P1.

As shown in FIG. 1C, a portion of the second display area DA2 is viewable in the sliding mode. In sliding mode, a shear or sliding force (MD2) may be applied to at least one of the first or second parts P1 and P2 in the first direction D1. When this force is applied, the first and second parts P1 and P2 may be displaced relative to one another to offset the first and second parts P1 and P2 in order to allow a portion of the second display area to be exposed and viewable by viewer.

For example, in sliding mode, shear force may be applied to the first part P1. Accordingly, the first part P1 may be planarly displaced toward the direction (e.g., fourth direction D4) opposite to the first direction D1. When the first part P1 is moved in the fourth direction D4 relative to the second part P2, the second display area DA2 may be partly uncovered, based on movement of the first part P1, to allow an image to be viewed on the uncovered portion of the second display area DA2.

The shear or sliding force may be also applied to the second part P2. For instance, the second part P2 may be pulled toward or pushed from the first direction D1. When this occurs, the shear force may be applied in the first direction D1 and the second part P2 may be planarly displaced toward the first direction D1. As the second part P2 is planarly displaced in the first direction D1 from the first part P1, a portion DA2-P of the second display area DA2, which was covered by the first part P1, may be uncovered and viewable by a user.

In one embodiment, the display module may display predetermined information in sliding mode. Therefore, the display module may reduce power consumption, while at the same time display information, albeit in a relatively smaller display area.

Additionally, the third part P3 may be deformed by the shear or sliding force. For example, when the first part P1 slides, or is planarly displaced from, the second part P2, the shear force may cause the third part P3 to change in state in order to allow for the offset between the first and second parts P1 and P2. The changing state of the third part P3 may be changing its position, changing its shape, or etc.

For example, the third part P3 may be rotated or otherwise change shape. In one embodiment, the third part P3 may rotationally deform (e.g., revolve along a circular path relative to an axis) by the shear or sliding force. When this occurs, one portion of the third part P3 may be elongated and another portion may contract by the shear force. For example, edges of the third part P3 may be aligned in the folded mode. However, in the sliding mode, the edges of third part P3 may be offset in order to expose an image in a portion DA2-P of the second display area DA2. Because the third part P3 may change its state based on the shear force as described above, less stress may be applied to the display module, which may improve reliability.

Figure 2:
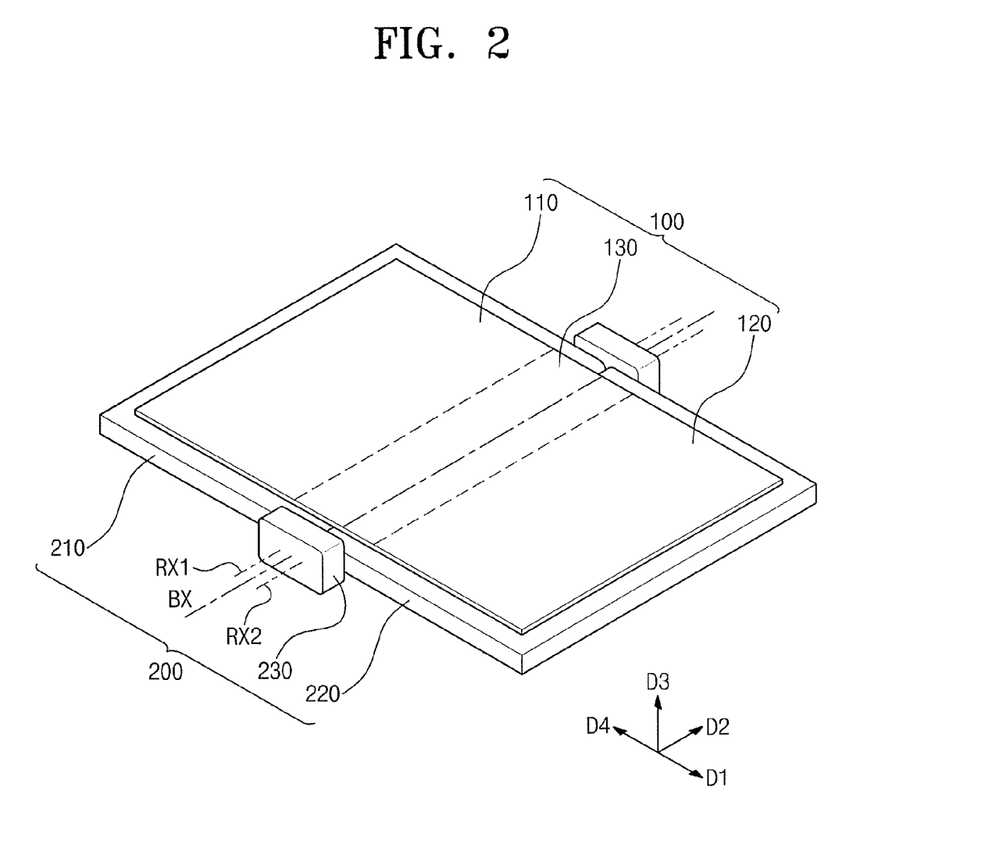
FIG. 2 illustrates another embodiment of a display module.
Figure 3A:
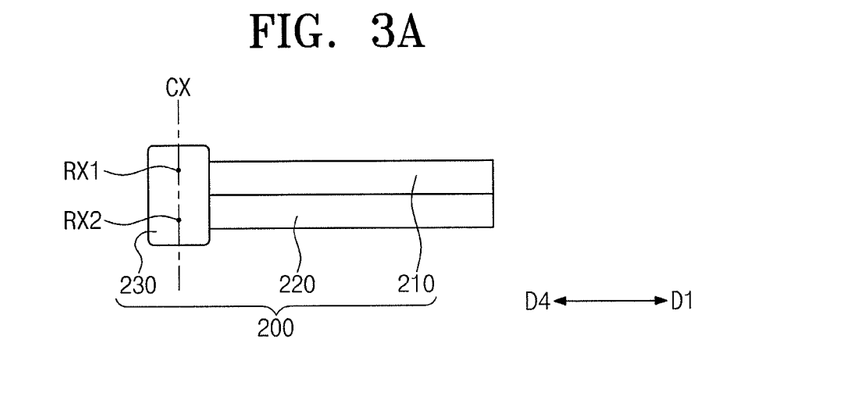
FIGS. 3A-3C illustrate another embodiment of a display module.
Figure 3B:
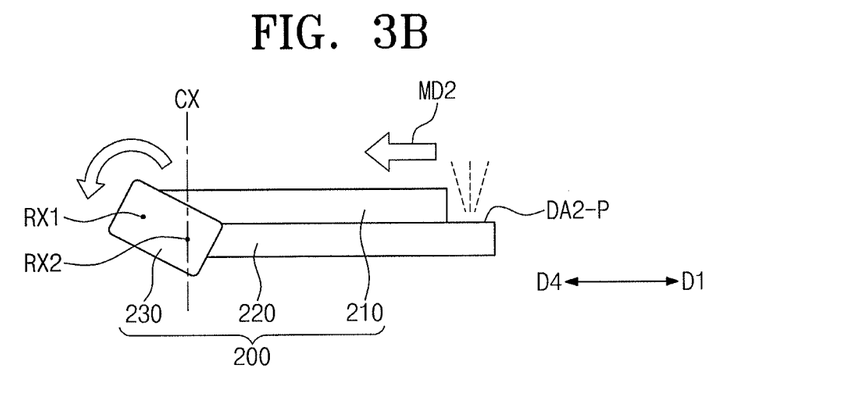
Figure 3C:
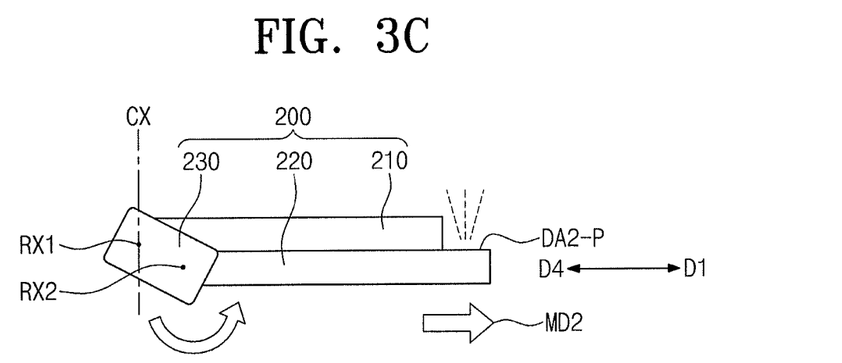

FIG. 2 illustrates another embodiment of a display module and FIGS. 3A-3C illustrate different modes or states of the display module in FIG. 2. The modes in FIGS. 3A-3C are spread, folding, and sliding modes in this order. FIGS. 3A to 3C are depicted without a display panel 100 for simplicity.

The display module includes a display panel 100 and a housing 200. The display panel 100 receives electrical signals to display images. The display panel 100 is a flexible display panel which, for example, may bend, fold, or spread out to correspond with a shape of the display module.

As shown in FIG. 2, the display panel 100 may be in the housing 200. In another embodiment, the housing may have a predetermined internal space confined therein and the display panel 100 may be accommodated in the internal space. The display panel 100 may display images based on electrical signals and may be embodied in various forms. For instance, the display panel 100 may be an organic light emission display panel, an electrophoretic display panel, or an electrowetting display panel.

In one embodiment, the display panel 100 may be a touch screen panel to detect external touch signals. The touch screen panel may detect an external touch signal and display an image corresponding thereto.

The touch screen panel may be formed in one body including a stacked arrangement of a display part and a touch part. In another embodiment, a display substrate and a touch substrate may be independently prepared and combined with each other by a fabrication process. The touch screen panel may detect an external touch signal in various ways, e.g., using resistive film, electrostatic capacitance, or optics.

The display panel 100 may include at least one of the following optical substrates, e.g., a polarization substrate, a reflection substrate, a protection substrate, or a retardation substrate. The optical substrate may be useful for improving visibility of an image expressed by the display panel 100, and/or may prevent display quality from degrading due to reflection of external light.

The display panel 100 may include a first region 110, a second area 120, and a third area 130. The third area 130 is between the first and second areas 110 and 120. The third area 130 may including a folding axis BX and may be spread out or bend along or relative to the folding axis BX. The first area 110, the second area 120 and third area 130 may respectively correspond to or include, for example, the first display area DA1, the second display area BA2 and the folding area FA in FIG. 1A.

The housing 200 may be coupled to the display panel 100. The shape of the display module may be dependent, for example, upon operation of the housing 200. The housing 200 may fold or unfold along the folding axis BX which extends in the second direction DR2. The modes of the display module may be classified in accordance with operation of the housing 200.

At least a part of the display panel 100 may be flexibly coupled to the housing 200. For instance, the second area 120 may be fixed to a second body part 220 of the housing 200, and the first area 110 may be flexibly coupled to a first body part 210 of the housing 200. As a result of the flexible coupling with the first and second body parts 210 and 220, the first area 110 and the second area 120 may be free from being displacement from the body parts 210 and 220, respectively. To lessen stress when the display panel 100 is folded, the third area 130 may fold in a predetermined curvature relative to the folding axis BX.

The first area 110 may be easily displaced inwardly from the edge of the first body part 210, forming a curvature at the third area 130. Since at least a part of the display panel 100 is flexibly coupled to the housing 200, folding stress on the display panel 100 may be reduced and reliability of the display apparatus may be improved.

The housing 200 includes a first body part 210 overlaid with the first area 110, a second body part 220 overlaid with the second area 120, and a third body part 230 connecting the first and second body parts 210 and 220. In this embodiment, the third body part 230 may include a plurality of parts separately disposed in the second direction D2. In another embodiment, the third body part 230 may be formed as one body.

The third body part 230 may include a first axis of rotation RX1 and a second axis of rotation RX2. When the third body part includes a plurality of third body parts 230, the third body parts may be coupled each other by one or more connectors that extend along the second axis of rotation RX2. The third body part 230 may be directly or indirectly coupled to the first and second body parts 210 and 220.

The first body part 210 may be coupled to the third body part 230 in a region which includes the first axis of rotation RX1. For example, the first axis of rotation RX1 may pass through a hole in the first body part 230. The third body part 230 may be coupled to the first body part 210 by a connector in the hole. The second axis of rotation RX2 may pass through another hole in the third body part. The third body part 230 may be coupled to the second body part 220 by a connector in this other hole.

In this embodiment, the third body part 230 may be deformed or move when a shear or sliding force is applied. For example, the third body part 230 may rotate on at least one of the first and second axis of rotations RX1 and RX2 when a shear or sliding force is applied to at least one of the first body part 210 or second body part 220.

As shown in FIG. 3A, the first and second axis of rotations RX1 and RX2 may be aligned along a central axis CX in folding mode. The first axis of rotation RX1 may pass through a junction or area where the first and third body parts 210 and 230 are joined and/or overlap. The second axis of rotation RX2 may pass through a junction or area where the second and third body parts 220 and 230 are joined and/or overlap.

As shown in FIG. 3B, the third body part 230 moves rotationally relative to the second axis of rotation RX2 in sliding mode. When a shear or sliding force (MD2) is applied to at least one of the first body part 210 or the second body part 220, the first body part 210 is planarly displaced in the fourth direction D4. The force is transferred to the third body part 230 to cause the third body part 230 to begin to rotate along the second axis of rotation RX2.

As shown in FIG. 3C, in sliding mode, the third body part 230 is also rotationally displaced relative to the first axis of rotation RX1. When this occurs, the shear force acts to cause the second body part 220 to be planarly displaced in the first direction D1. This creates an offset between the first body part 210 and the second body part 220. The offset allows a display area DA2-P of the second display area DA2 to be exposed to display all or a portion of an image. In one embodiment, in sliding mode, the entire second display region DA2 may be turned off except for area DA2-P. In this case, the display area DA2-P is used as a smaller display area which allows a user to still view an image or other information in the display area when the display module is in sliding mode. Accordingly, deterioration of the display module (e.g., that might otherwise occur in the folded state) may be reduced or prevent, reliability of the display module may be improved, and power consumption may be reduced.

Figure 4A:
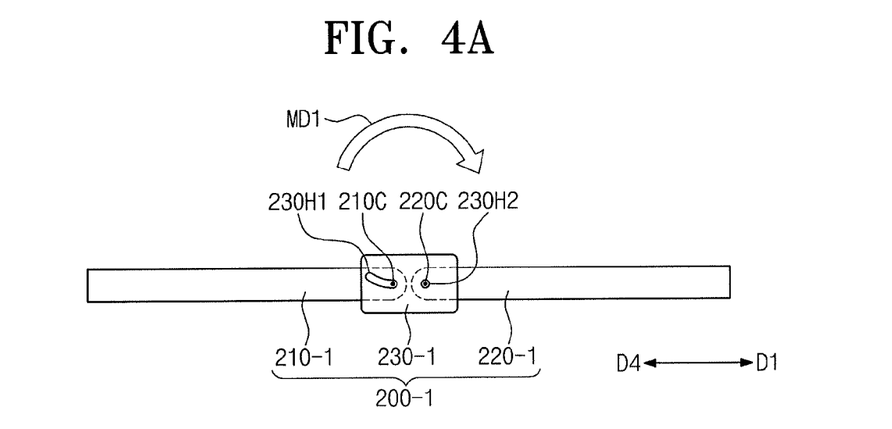
FIGS. 4A-4C illustrate another embodiment of a display module.
Figure 4B:
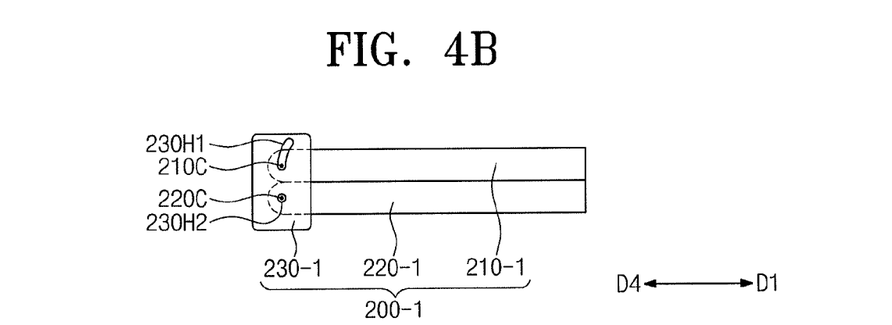
Figure 4C:
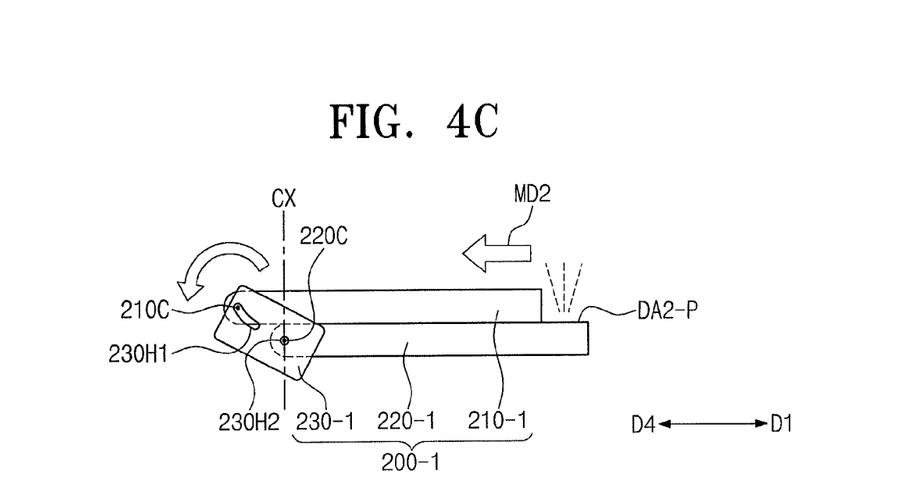

FIGS. 4A-4C illustrate another embodiment of a display module in different modes. The modes are spread, folding, and sliding modes in this order. As shown in FIGS. 4A and 4B, a first body part 210-1 includes a first coupler 210C and the second body part 220-1 includes a second coupler 220C. A third body part 230-1 includes a first hole 230-H1 and a second hole 230-H2. The first coupler 210C is in the first hole 230-H1 to couple the first body part 210-1 to the third body part 230-1. The first hole 230-H1 may be, for example, a sliding or slotted hole. The first coupler 210C moves (e.g., slides) from one side to another side of the first hole 230-H1.

Thus, the first coupler 210C may change position and may allow for rotation relative to the first axis of rotation RX1 in FIG. 1.

The second coupler 220C is in the second hole 230-H2 to couple the second body part 220-1 to the third body part 230-1. The second hole 230-H2 may have a circular shape or another shape. The second hole 230-H2 may be slightly larger in size than the second coupler 220C. This close fit allows the second hole 230-H2 to secure the second coupler 230C while still allowing the display module to change modes. The second hole 230-H2 may correspond to the second axis of rotation RX2 in FIG. 2.

The second hole 230-H2 may act to fix the second body part 220-1 in such a manner as to allow the first body part 210-1 to be easily displaced. The second coupler 220C of the second body part 220-1 may be fixed at the second hole 230-H2 and the third body part 230-1 may rotationally move relative to the axis passing through the second hole 230-H2.

As shown in FIG. 4C, the third body part 230-1 may rotationally move in the fourth direction D4 relative to the second hole 230-H2. The third body part 230-1 may rotationally move in the fourth direction D4 relative to the central axis CX. In this case, the first coupler 210C may move in the first hole 230-H1 along the first hole 230-H1. The first coupler 210C may slide along the shape of the first hole 230-H1. Then, the first body part 210-1 may be planarly displaced in the fourth direction D4 along the first hole 230-H1. The first body part 210-1 may be displaced to a greater extent in the fourth direction D4 than the second body part 220-1, to thereby allow display area DA2-P of the second area 120 to be exposed for displaying an image.

In one embodiment, the second hole 230-H2 may be a sliding or slotted hole. In this case, the third body part 230-1 may be rotationally displaced in the first direction relative to the first hole 230-H1. Then, the second body part 220-1 may be planarly displaced along the sliding hole toward the first direction D1, to thereby reveal display area DA2-P in the second area 120.

In one embodiment, the first and second holes 230-H1 and 230-H2 may be sliding or slotted holes. In this case, the first and second body part 210-1 and 220-1 may be displaced in reverse directions to reveal the display area DA2-P of second area 120.

Figure 5A:
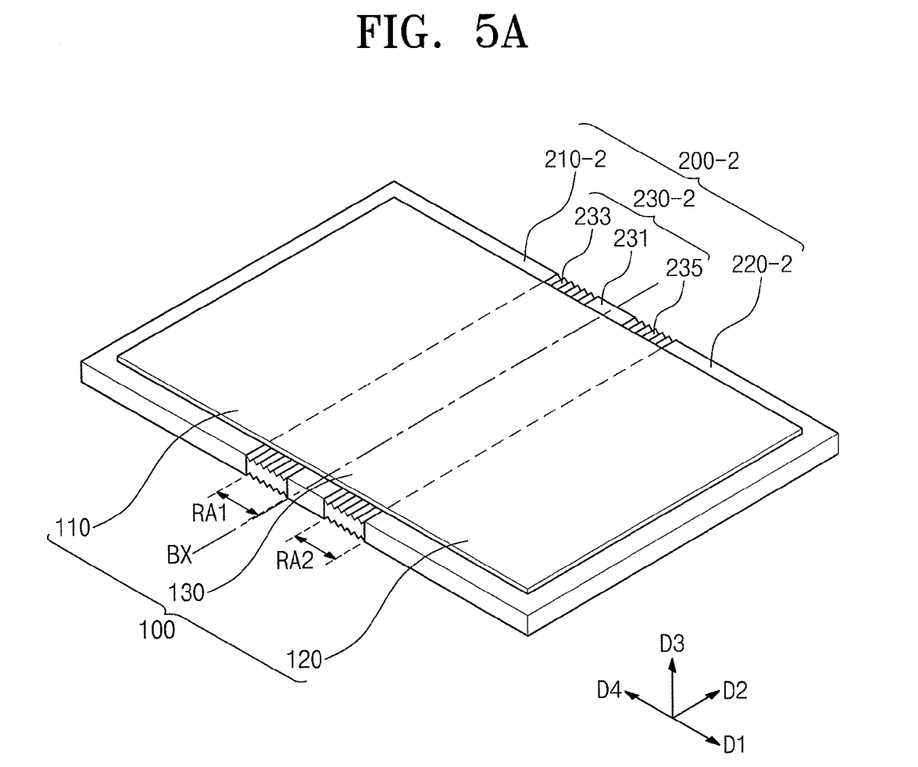
FIGS. 5A-5C illustrate another embodiment of a display module.
Figure 5B:
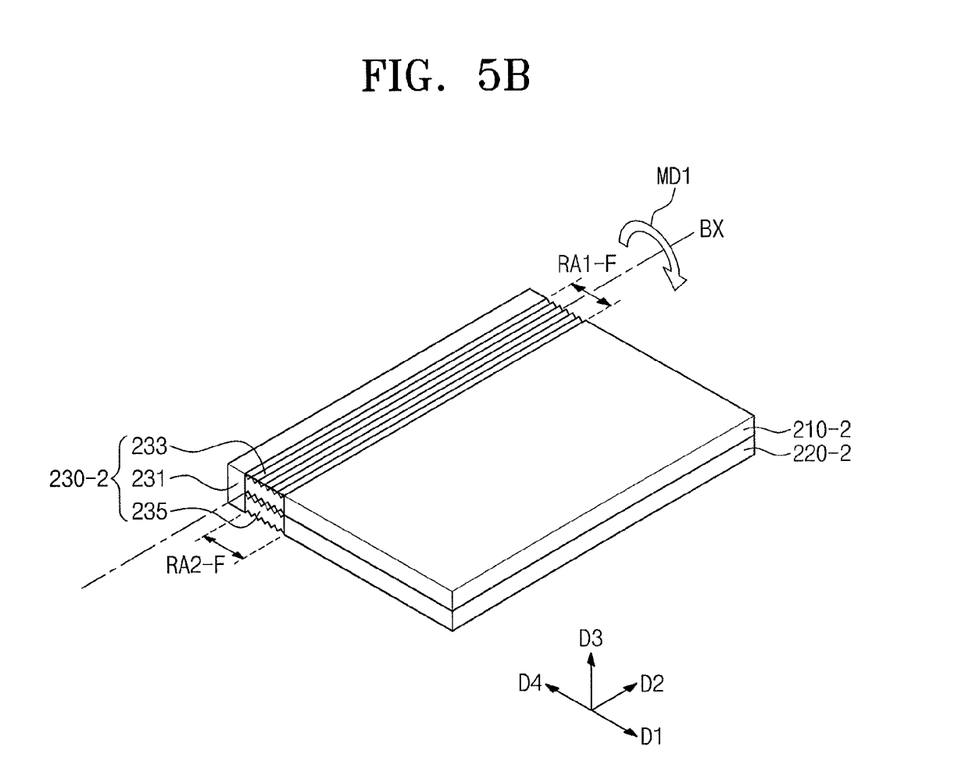
Figure 5C:
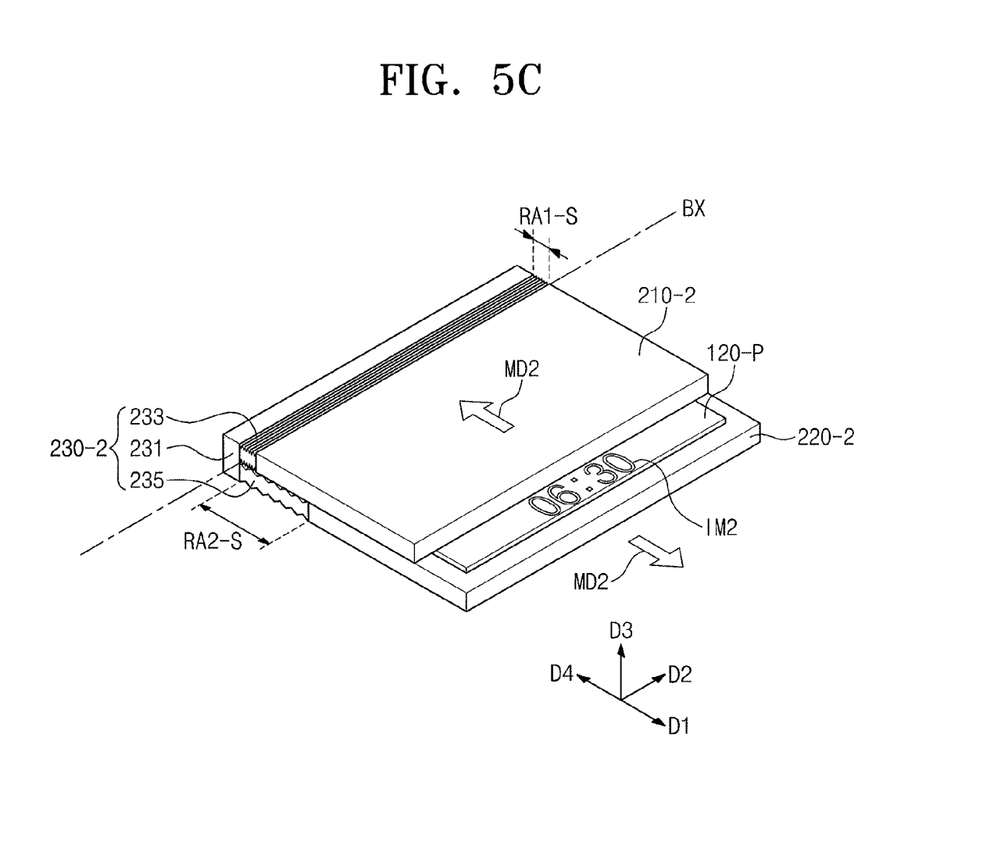

FIGS. 5A-5C illustrates another embodiment of a display module in spread, folding and sliding modes in this order. The display module in FIGS. 5A-5C may have the same configuration with that shown in FIG. 2, except for housing 200-2.

The housing 200-2 includes a first body part 210-2, a second body part 220-2, and a third body part 230-2 between the first and second body parts 210-2 and 220-2. The first and second body parts 210-2 and 220-2 may correspond to the first and second parts P1 and P2 of FIG. 1. The third body part 230-2 may extend or contract when a shear or sliding force is applied. For example, the third body part 230-2 may extend or contract in terms of width in the first direction D1.

As shown in FIG. 5A, the third body part 230-2 includes a connector 231, a first release part 233, and a second release part 235. The first release part 233 may couple the first body part 210 to the connector 231. The second release part 235 may couple the second body part 220 to the connector 231.

The first release part 233 may allow the first body part 210-2 to extend and contract to a greater extent than the second release part 235 allows the second body part 220-2 to extend and contract. The first body part 210-2 may be heavier than the first release part 233, and the second body part 220-2 may be heavier than the second release part 235. These differences in weight may allow the display module to change between modes when a shear or sliding force is applied.

The width RA1 (e.g., first release width) of the first release part 233 in the first direction D1 may increase or decrease. When the first release width RA1 increases, the first release part 233 may extend to have a larger area. When the first release width RA1 decreases, the first release part 233 may contract to have a smaller area. Similarly, when the width RA2 (e.g., second release width) of the second release part 235 extends in the first direction D1, the second release part 235 increases in area. When the second release width RA2 decreases, the second release part 235 contracts to have a smaller area.

The first and second release parts 233 and 235 have changeable structures. For example, the first and second release parts 233 and 235 may be formed of flexible materials to allow them to change size/area in the first and fourth directions D1 and D4. For example, the first and second release parts 233 and 235 may be formed of one or more polymers having elasticity. In another embodiment, the first and second release parts 233 and 235 may include a plurality of brackets to allow for their lengths to change in the first and fourth directions D1 and D4.

In one embodiment, each of the first and second release parts 233 and 235 may include a plurality of rumples. The rumples may extend, for example, in the second direction D2 and may isolated from (but connected to) one another in the first direction D1. The third body part 230-2 may contract or extend based on a change in the isolation intervals of the rumples.

In one embodiment, the first release width RA1 may be substantially identical to the second release width RA2. In another embodiment, the first and second release widths RA1 and RA2 may be different. This may allow for different types or extents of movements, at least in the sliding mode of the display module.

As shown in FIG. 5B, in folding mode, the first release 233 may be on the same plane as the first body part 210-2 and the second release 235 may be on the same plane as the second body part 220-2. The first release part 233 may be rotationally displaced together with the first body part 210-2 and then placed on the second release part 235.

In folding mode, first and second release widths RA1-F and RF2-F may be substantially identical to those in the spread mode. Also, in folding mode, the first release part 233 and the first body part 210-2 maybe rotated over the second release part 235 and the second body part 220-2. Thus, there may be no variation in widths of these parts.

As shown FIG. 5C, in sliding mode, the first release width RA1-S may be less than the first release width RA1-F in folding mode. Also, in sliding mode, the first release part 233 may contract to allow the first body part 210-2 to be planarly displaced (e.g., move) in the fourth direction D4 to create an offset between the first and second body parts 210-2 and 220-2. The offset allows a display area 120-P of the second display area DA1 to be exposed to allow viewing of an image, albeit in a smaller display area. A remainder of the second display area DA2 may be covered by the first body part 210-2.

Also, in sliding mode, the second release width RA2-S may be the same or different (e.g., smaller or larger) than the second release width RA2-F in folding mode. The second release part 235 may move to allow the second body part 220-2 to be planarly displaced in the first direction D1.

In one embodiment, the first and second body parts 210-2 and 220-2 may be planarly displaced (e.g., move) at the same time. This may be more effective than the case where only one of the first and second body parts 210-2 and 220-2 are displaced in sliding mode and, for example, may allow for the display area 120-P to be wider to display second image IM2. This may be accomplished even though the distances that each of the first and second body parts 210-2 and 220-2 move may be smaller compared to other embodiments.

In another embodiment, a display module may be configured without one of the first or second releases 233 and 235. In this configuration, only one of the first or second body parts 210-2 and 220-2 of the display module may be planarly displaced for displaying the second image IM2 in the sliding mode.

Figure 6A:
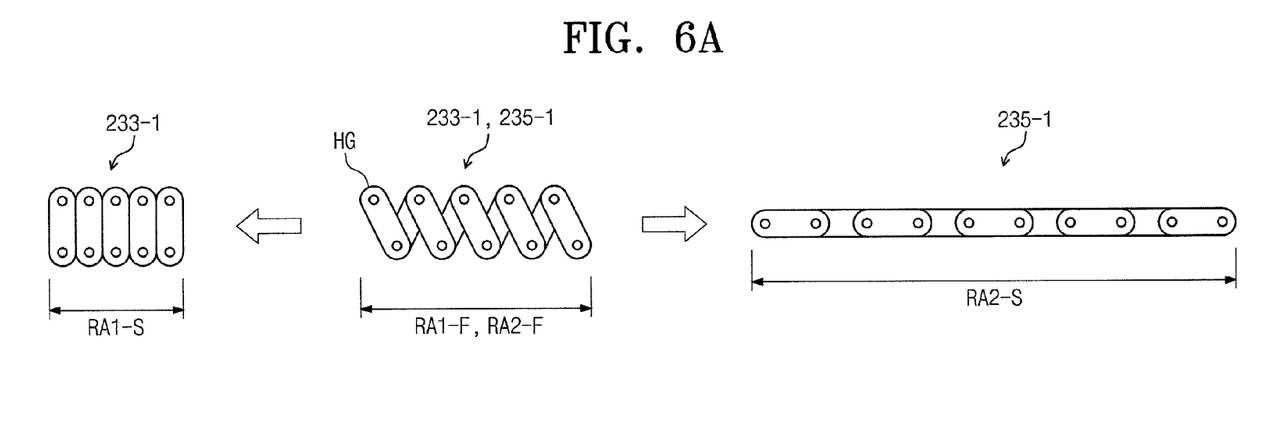
FIGS. 6A and 6B illustrate embodiments of releases.
Figure 6B:
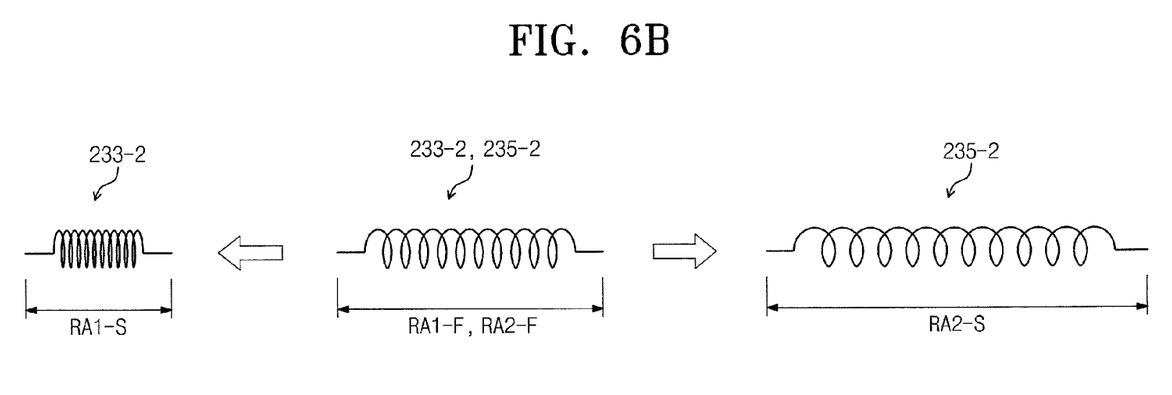

FIGS. 6A and 6B illustrate additional embodiments of releases for the display module. In FIG. 6A, each of first and second release parts 233-1 and 235-1 include pluralities of hinges HG coupled to each other. The hinges HG have a first release width RA1-F in folding mode, and are arranged at a predetermined angle relative to one another in this mode.

The hinges HG of the first release part 233-1 may be arranged closely to each other in sliding mode. Therefore, the first release width RA1-S in sliding mode may be less than the first release width RA1-F in folding mode.

The hinges HG of the second release part 235-1 may be distant from each other in sliding mode. Therefore, the second release width RA2-S in sliding mode may be greater than the second release width RA2-F in folding mode.

In FIG. 6B, each of first and second release parts 233-2 and 235-2 include at least one spring. The first release width RA1-F or the second release width RA2-F in folding mode may correspond, for example, the length of the spring.

The spring of the first release part 233-2 may contract in sliding mode. Therefore, the first release width RA1-S in sliding mode may be less than the first release width RA1-F in folding mode.

The spring of the second release part 235-2 may be extended in sliding mode. Therefore, the second release width RA2-S in sliding mode may be greater than the second release width RA2-F in folding mode.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the invention as set forth in the following claims.

What is claimed is:

1. A display module, comprising:
a first part in which a first display area is defined;
a second part in which a second display area is defined; and
a third part between the first and second parts and overlapping a folding axis in a plan view, wherein the folding axis extends in a first direction, the third part is to change from a first state to a second state when a force is applied, wherein:
the first part is folded over the second part along the folding axis to entirely cover the second display area when the third part is in the first position, and
the first part or the second part moves to allow a portion of the second display area to be exposed to display an image when the third part is in the second state, wherein the first and second parts are to move in a second direction when the force is applied, the second direction crossing the first direction.

2. The display module as claimed in claim 1, wherein the first part and the second part are to move in opposite directions.

3. The display module as claimed in claim 1, wherein the third part includes:
a first side coupled to the first part and in which a first axis of rotation is defined, wherein the first axis of rotation is substantially parallel to the folding axis; and
a second side coupled to the second part and in which a second axis of rotation is defined, wherein the second axis of rotation is substantially parallel to the folding axis, the third part is to rotate relative to at least one of the first axis of rotation or the second axis of rotation when the force is applied.

4. The display module as claimed in claim 3, wherein the first part is to move in a direction opposite to the second direction and the third part is to rotate relative to the second axis of rotation when the force is applied.

5. The display module as claimed in claim 3, wherein the second part is to move in the second direction and the third part is to rotate relative to the first axis of rotation when the force is applied.

6. The display module as claimed in claim 2, wherein the third part includes:
a first release part coupled to the first part and having a width that is to change when the first part moves,
a second release part coupled to the second part and having a width that is to change when the second part moves, each of the widths of the first and the second release parts measured in the second direction; and
a connector to couple the first release part and the second release part, the connector overlapping the folding axis.

7. The display module as claimed in claim 6, wherein the width of the first release part is to decrease when force is applied to the first part in a direction opposite to the second direction.

8. The display module as claimed in claim 6, wherein the width of the second release part is to increase when force is applied to the second part in a direction opposite to the second direction.

9. A display module, comprising:
a display panel divided into a first display area, a folding area, and a second display area arranged in a plane defined by a first direction and a second direction; and
a housing coupled to the display panel, the housing to fold and unfold along a folding axis substantially parallel to the first direction, wherein the housing includes:
a first body part overlapping the first display area;
a second body part overlapping the second display area; and
a third body part overlapping the folding area and coupling the first body to the second body, the third body is to change from a first state to a second state when a force is applied to move the first body part over the second body part, a first portion of the second display area covered by the first body part and a second portion of the second display area uncovered by the first body part, the second portion of the second display area to display a first image when the first body part is over the second body part, wherein at least one of the first or second body parts is to move in the second direction by changing of the third body part when the force is applied, and wherein the changing of the third body part is rotating basis on the folding axis or changing shape.

10. The display module as claimed in claim 9, wherein the first body part and the second body part is to move in opposite directions.

11. The display module as claimed in claim 9, wherein:
each of the first and second body parts includes a supporter to support the display panel and a coupler to couple the supporter to the third body part,
the third body part includes a first coupling hole including the coupler of the first body part to couple the first and third body parts, and a second coupling hole including the coupler of the second body part to couple the second and third body parts,
the first coupling hole at a first side of the third body part and the second coupling hole at a second side of the third body part, and
the third body part is rotate relative to at least one of the first or second coupling holes when the force is applied.

12. The display module as claimed in claim 11, wherein:
the first coupling hole is a sliding hole, and
the coupler of the first body part is to move along the sliding hole and the third body part is to rotate relative to the second coupling hole when the force is applied.

13. The display module as claimed in claim 9, wherein the third body includes:
a center region overlapping the folding axis;
a first release part connected to the center region and coupled to the first body part; and
a second release part connected to the center region and coupled to the second body part, a width of at least one of the first or second release parts to change force when the force is applied.

14. The display module as claimed in claim 13, wherein the first release part is to receive a higher level of strain than the first body part when the force is applied.

15. The display module as claimed in claim 14, wherein the first release part has elasticity to deform in width in the first direction.

16. The display module as claimed in claim 14, wherein each of the first and second release parts includes a plurality of rumples to move in the first direction and arranged in the second direction, an interval between the rumples to change when the force is applied.

17. The display module as claimed in claim 9, wherein:
the first display area, the second display area, and the folding area are on substantially a same plane when the housing is unfolded, and
the first and second display areas are to face each other and the first body part is to cover the first and second portions of the second display area when the housing is folded.

18. The display module as claimed in claim 17, wherein:
the display panel is to display a second image when the housing is unfolded,
the display panel is to display the first image different from the second image on the second portion of the second display area, the first display part to cover the first portion of the second display area and the second portion of the second display area exposed to display the first image when the force is applied.

* * * * *